(12) United States Patent
Lee et al.

(10) Patent No.: US 7,501,674 B2
(45) Date of Patent: Mar. 10, 2009

(54) SEMICONDUCTOR DEVICE HAVING FIN TRANSISTOR AND PLANAR TRANSISTOR AND ASSOCIATED METHODS OF MANUFACTURE

(75) Inventors: Deok-Hyung Lee, Seoul (KR);
Yu-Gyun Shin, Seongnam-si (KR);
Jong-Wook Lee, Yongin-si (KR);
Min-Gu Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 120 days.

(21) Appl. No.: 11/244,136

(22) Filed: Oct. 6, 2005

(65) Prior Publication Data

US 2006/0081895 A1 Apr. 20, 2006

(30) Foreign Application Priority Data

Oct. 19, 2004 (KR) .................... 10-2004-0083691

(51) Int. Cl.
*H01L 21/00* (2006.01)
(52) U.S. Cl. .................. 257/288; 257/349; 257/401; 438/284; 438/426; 438/206
(58) Field of Classification Search ................ 257/263, 257/287, E29.259, E29.264, 288, 349, 401; 438/284, 426, 206
See application file for complete search history.

(56) References Cited

U.S. PATENT DOCUMENTS 4,450,620 A    5/1984  Fuls et al.
6,780,712 B2   8/2004  Hsieh
6,949,768 B1*  9/2005  Anderson et al. ............. 257/74
7,071,048 B2*  7/2006  Son et al. .................... 438/206
7,105,934 B2*  9/2006  Anderson et al. ........... 257/213
7,317,230 B2*  1/2008  Lee et al. .................... 257/401
2003/0190791 A1  10/2003  Fischetti et al.
2003/0193058 A1  10/2003  Fried et al.
2004/0036118 A1   2/2004  Abadeer et al.
2004/0266076 A1* 12/2004  Doris et al. ................. 438/157
2005/0093082 A1*  5/2005  Son et al. .................... 257/401
2005/0104096 A1*  5/2005  Lee et al. .................... 257/288
2005/0167750 A1*  8/2005  Yang et al. .................. 257/347
2005/0173768 A1*  8/2005  Lee et al. .................... 257/401
2006/0081895 A1*  4/2006  Lee et al. .................... 257/288
2006/0202270 A1*  9/2006  Son et al. .................... 257/349
2007/0172770 A1*  7/2007  Witters et al. ............... 430/313
2007/0235785 A1* 10/2007  Kahng et al. ................ 257/297
2007/0267676 A1* 11/2007  Kim et al. .................... 257/311
2007/0272971 A1* 11/2007  Lee et al. .................... 257/321
2008/0029821 A1*  2/2008  Yamagami et al. .......... 257/365
2008/0124893 A1*  5/2008  Kim et al. .................... 438/426

FOREIGN PATENT DOCUMENTS

JP        2004-088101        3/2004

* cited by examiner

*Primary Examiner*—Laura M Menz
(74) *Attorney, Agent, or Firm*—Volentine & Whitt, PLLC

(57) ABSTRACT

Disclosed is a fin transistor and a planar transistor and a method of forming the same. The fin transistor and the planar transistor are formed to have gate electrodes with similar thicknesses by selectively recessing a semiconductor substrate in a planar region where the planar transistor is formed.

14 Claims, 14 Drawing Sheets

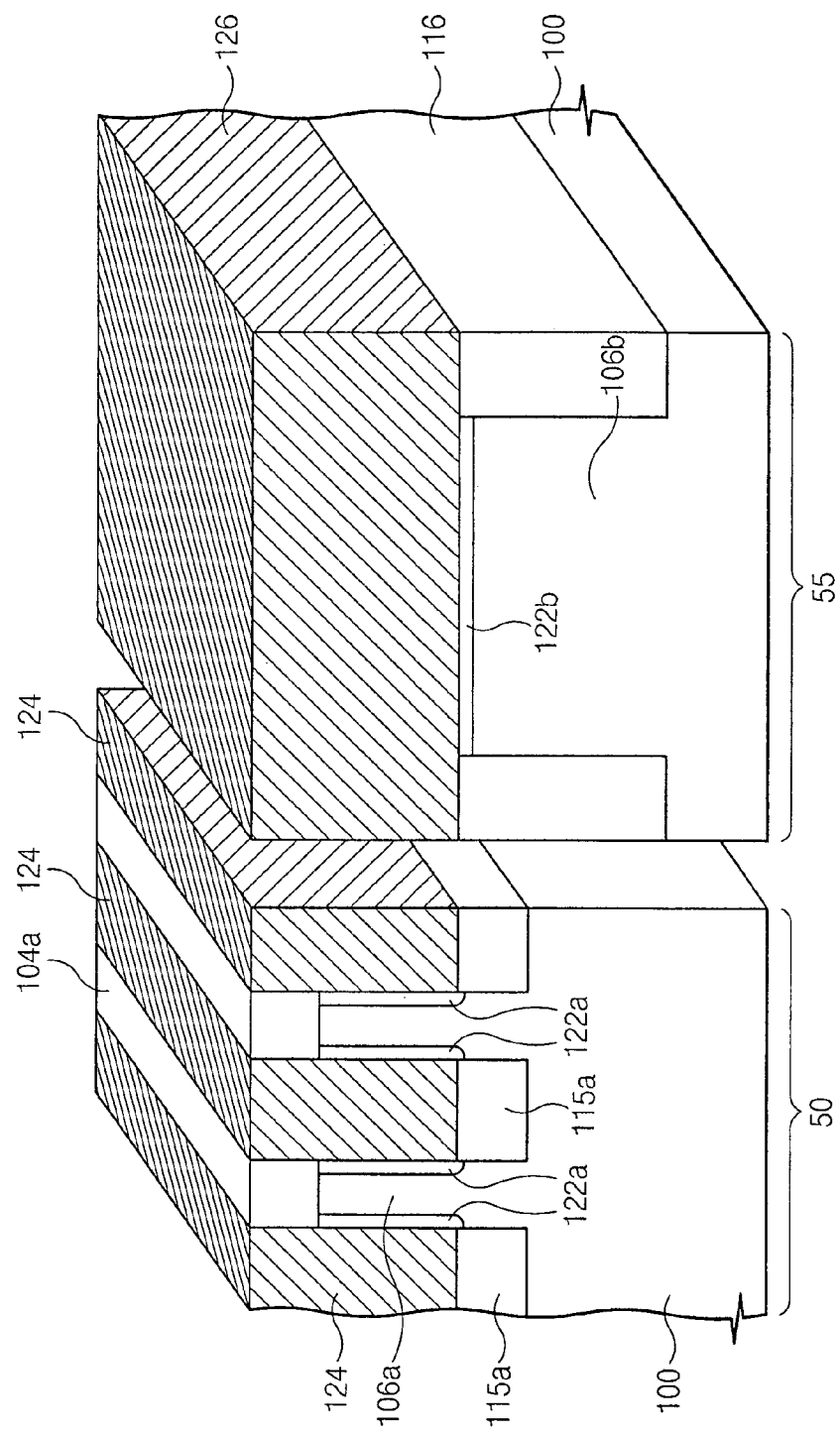

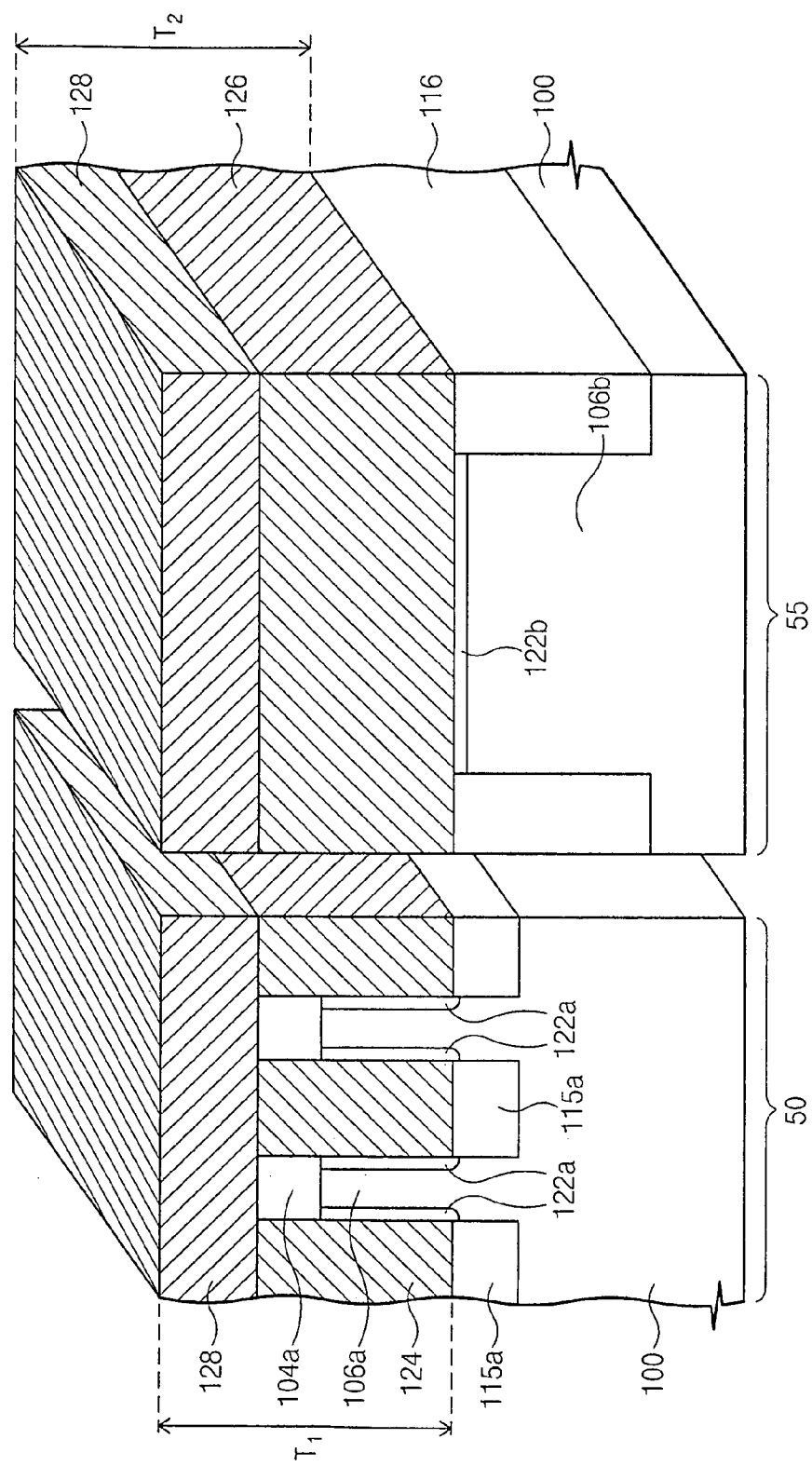

SEMICONDUCTOR DEVICE HAVING FIN TRANSISTOR AND PLANAR TRANSISTOR AND ASSOCIATED METHODS OF MANUFACTURE

BACKGROUND OF THE INVENTION

1. Field of the Invention

The present invention relates generally to a semiconductor memory device and a method of manufacturing the same. More particularly, the invention relates to a semiconductor memory device having a fin transistor and a planar transistor and a method of manufacturing the same.

A claim of priority is made to Korean Patent Application No. 10-2004-0083691 filed on Oct. 19, 2004, the disclosure of which is hereby incorporated by reference in its entirety.

2. Description of the Related Art

Field effect transistors (FETs) are perhaps the most common elements found in modern semiconductor integrated circuits (ICs). Within contemporary semiconductor ICs, FETs are characterized by decreasing size and, therefore, increasing fabrication density. This trend is important because significant performance gains in semiconductor ICs may be obtained by producing smaller, more densely packed (i.e., more highly integrated) FETs.

Unfortunately, the fabrication of smaller, more densely packed FETs can lead to a variety of operational and structural problems. For example, scaling down the size of a FET can lead to a phenomenon called "punch through", whereby source and drain depletion regions fuse together to form a single depletion region, thereby causing drain current to become highly dependent on a drain-source voltage.

Fin FET transistors have been introduced to address the punch through problem, among other problems. A fin FET transistor (hereafter, "fin transistor") includes a silicon fin structure formed on a semiconductor substrate and a gate electrode formed across the fin structure. The gate electrode is formed in contact with an upper surface and sidewalls of the fin structure. A channel region under the gate electrode is defined by the upper surface and sidewalls of the fin structure. As such, the fin structure effectively creates a wide channel within a limited space, thus allowing a significant amount of current to flow through the channel when the transistor is turned on. In addition, since the gate electrode controls the channel region through the upper surface and sidewalls thereof, the gate is able to more effectively control the channel region to prevent undesirable effects such as punch-through. Because of the above-described characteristics, the fin transistor can be applied to various semiconductor devices.

Semiconductor devices may include fin transistors together with planar FETs (hereafter, planar transistors). A planar transistor is a conventional transistor with a planar channel region. In certain semiconductor devices, in particular, dynamic random access memory (DRAM) devices, the fin transistor may be formed in a cell region, and the planar transistor may be formed in a peripheral circuit region next to the cell region.

FIGS. 1 through 3 are perspective views illustrating a method of forming a semiconductor device having a conventional fin transistor and a planar transistor. In FIGS. 1 through 3, reference symbol "a" indicates a fin region where a fin transistor is formed, and reference symbol "b" indicates a planar region where a planar transistor is formed.

Referring to FIG. 1, first and second hard mask patterns 3a and 3b are formed on a semiconductor substrate 1 in respective regions "a" and "b". Semiconductor substrate 1 is anisotropically etched using first and second hard mask patterns 3a and 3b as an etch mask to form a fin active region 5a in fin region "a" and a planar active region 5b in planar region "b". Planar active region 5b is formed to be wider than fin active region 5a, and upper surfaces of fin and planar active regions 5a and 5b have roughly the same height.

Fin active region 5a and planar active region 5b are bounded by respective first and second trenches formed by the anisotropic etching. After fin and planar active regions 5a and 5b are formed, a silicon oxide layer 7 filling the first and second trenches is formed on a whole surface of semiconductor substrate 1.

Referring to FIG. 2, a preliminary fin device isolation layer 7a and a planar device isolation layer 7b are formed in respective fin and planar regions "a" and "b" by planarizing silicon oxide layer 7 until hard mask patterns 3a and 3b are exposed. A photo sensitive pattern (not shown) covering planar region "b" is then formed. The preliminary fin device isolation layer is etched to form a fin device isolation layer 7a covering lower sidewalls of fin active region 5a. Thus, upper sidewalls of fin active region 5a are left exposed. Fin device isolation layer 7a has a relatively low height compared with planar device isolation layer 7b. Hard mask patterns 3a and 3b are selectively removed to expose upper surfaces of fin and planar active regions 5a and 5b.

A thermal oxidation process is performed on semiconductor substrate 1 to form a sidewall gate oxide layer 9a on exposed areas of fin active region 5a and a planar gate oxide layer 9b on exposed areas of planar active region 5b. A gate conductive layer 11 is then formed over an entire surface of the semiconductor substrate 1.

Referring to FIG. 3, gate conductive layer 11 is patterned to form a fin gate electrode 11a crossing fin active region 5a and a planar gate electrode 11b crossing planar active region 5b. Fin gate electrode 11a is formed in contact with an upper surface and both sidewalls of fin active region 5a, and planar gate electrode 11b is in contact with an upper surface of planar active region 5b.

In the above-described method, gate conductive layer 11 is formed with different thicknesses on fin and planar regions "a" and "b" owing to the difference in the heights of respective fin and planar device isolation layers 7a and 7b. Accordingly, gate electrodes 11a and 11b have different heights and therefore a greater portion of gate conductive layer 11 has to be etched to form gate electrode 11a than to form gate electrode 11b.

Because a greater portion of gate conductive layer 11 must be etched to form gate electrode 11a, planar gate oxide layer 9b and planar active region 5b on both sides of planar gate electrode 11b may be excessively etched while gate electrode 11a is being formed. As a result, planar gate oxide layer 9b and planar active region 5b may be damaged. This damage often results in defects to the electrical characteristics of the fin transistor. For example, leakage current may flow through source/drain regions (not shown) at both sides of planar gate electrode 11b, and a contact resistance therebetween may be increased.

SUMMARY OF THE INVENTION

According to one embodiment of the present invention, a semiconductor device is provided. The semiconductor device comprises a semiconductor substrate defining a fin region and a planar region, a fin active region formed on the semiconductor substrate in the fin region and protruding upward from the semiconductor substrate, and a planar active region formed on the semiconductor substrate in the planar region and protruding upward from the semiconductor substrate, wherein the planar active region has an upper surface which is lower than an upper surface of the fin active region. The semiconductor device further comprises a fin device isolation layer covering lower sidewalls of the fin active region, a planar device isolation layer completely covering sidewalls of the planar active region, a fin gate electrode formed across the fin active region, and a planar gate electrode formed across the planar active region.

According to another embodiment of the invention, a method of forming a semiconductor device is provided. The method comprises forming a fin active region on a semiconductor substrate defining a fin region and a planar region, the fin active region protruding upward from the semiconductor substrate in the fin region, and forming a planar active region on the semiconductor substrate, the planar active region protruding upward from the semiconductor substrate in the planar region and having an upper surface lower than an upper surface of the fin active region. The method further comprises forming a fin device isolation layer covering lower sidewalls of the fin active region, forming a planar device isolation layer completely covering sidewalls of the planar active region, forming a fin gate electrode across the fin active region, and forming a planar gate electrode across the planar active region.

BRIEF DESCRIPTION OF THE DRAWINGS

The invention is described below in relation to several embodiments illustrated in the accompanying drawings. Throughout the drawings like reference numbers indicate like exemplary elements, components, or steps. In addition, the thickness of layers is exaggerated for clarity. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

In this written description, the terms "on" and "onto" are used to describe relative positions of layers in a semiconductor device. In order for a layer to be "on" or "onto" another layer according to this description, the layer does not have to be directly on top of the other layer; i.e., intervening layers could be present between the two.

Figure 4:
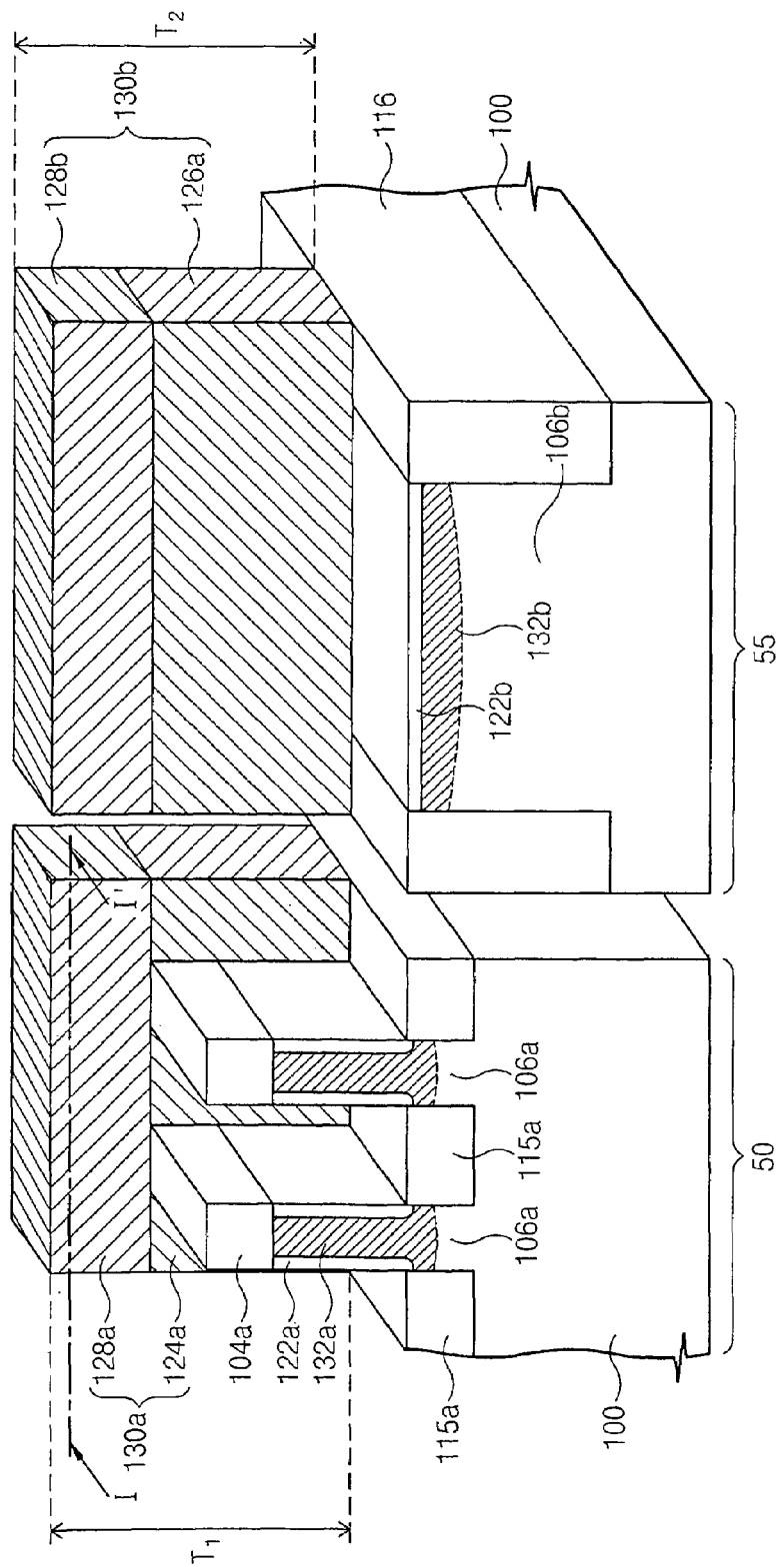
FIG. 4 is a perspective view of a semiconductor device having fin and planar transistors according to an embodiment of the present invention.
Figure 5:
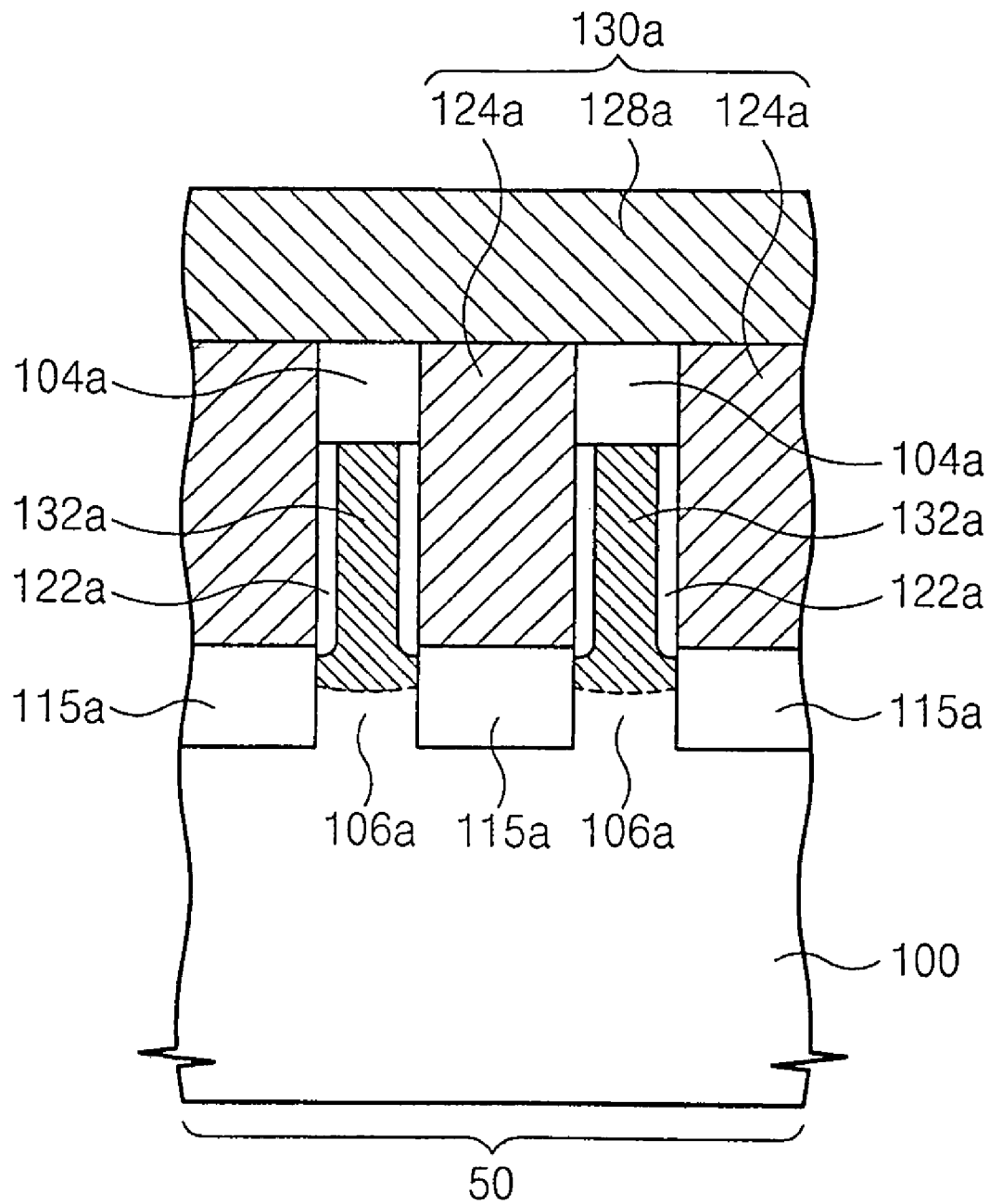
FIG. 5 is a cross-sectional view taken along a line between I and I' in FIG. 4; and, FIGS. 6 to 14 are perspective views illustrating a method of forming a semiconductor device having fin and planar transistors according to an embodiment of the present invention.

FIG. 4 is a perspective view of a semiconductor device having fin and planar transistors according to an embodiment of the present invention. FIG. 5 is a cross-sectional view taken along a line between I and I' in FIG. 4. In FIGS. 4 and 5, reference numeral 50 denotes a fin region where a fin transistor is formed and reference numeral 55 indicates a planar region where a planar transistor is formed.

Referring to FIGS. 4 and 5, the semiconductor device comprises a semiconductor substrate 100 formed in fin region 50 and planar region 55. A fin active region 106a is formed on substrate 100 in fin region 50 and a planar active region 106b is formed on semiconductor substrate 100 in planar region 55. Both fin active region 106a and planar active region 106b protrude upwards from substrate 100, but an upper surface of planar active region 106b is formed to be lower than an upper surface of fin active region 106a.

A fin device isolation layer 115a covering lower sidewalls of fin active region 106a is formed on substrate 100 in fin region 50, and a planar device isolation layer 116 completely covering sidewalls of planar active region 106b is formed on substrate 100 in planar region 55. An upper surface of planar device isolation layer 116 is roughly the same height as an upper surface of planar active region 106b, and a lower surface of planar device isolation layer 116 is lower than a lower surface of fin device isolation layer 115a.

Preferably, fin and planar device isolation layers 115a and 116 are formed of a material having an excellent gap-fill characteristic. For instance, fin and planar device isolation layers 115a and 116 may be formed of a high-density plasma silicon oxide layer, or a silicon on glass (SOG) layer. Preferably, the fin and planar device isolation layers 115a and 116 are formed of the same material.

As described above, the upper surface of planar active region 106b is lower than that of fin active region 106a. Moreover, it is preferable that the upper surface of planar active region 106b has a height similar to the upper surface of fin device isolation layer 115a.

A fin gate electrode 130a is formed across fin active region 106a, and a planar gate electrode 130b is formed across planar active region 106b. Fin gate electrode 130a is formed in contact with the upper surface and both sidewalls of fin active region 106a. In contrast, since planar device isolation layer 116 completely covers sidewalls of planar active region 106b, planar gate electrode 130b is in contact with the upper surface of planar gate electrode 130b, but not the sidewalls.

Preferably, a first gate insulating layer 122a is interposed between fin gate electrode 130a and upper sidewalls of fin active region 106a, and a fin hard mask pattern 104a is interposed between fin gate electrode 130a and an upper surface of fin active region 106a. In addition, a second gate insulating layer 122b is interposed between planar gate electrode 130b and planar active region 106b. Preferably, fin hard mask pattern 104a is thicker than first gate insulating layer 122a so that a channel region is not formed on the upper surface of fin active region 106a. This prevents an electric field from being concentrated at an upper edge of fin active region 106a. As a result, a hump phenomenon caused by concentration of the electric field on the upper edge of the fin active region is avoided.

Preferably, fin gate electrode 130a includes a sidewall gate 124a and a top gate 128a. Sidewall gate 124a is formed on the upper sidewalls of fin active region 106. First gate insulating layer 122a is interposed between sidewall gate 124a and the upper sidewalls of fin region 106a and top gate 128a is formed on the upper surface of fin active region 106a over fin hard mask pattern 104a. In general, an upper surface of sidewall gate 124a has the same height as an upper surface of fin hard mask pattern 104a and top gate 128a is electrically connected to sidewall gate 124a.

Preferably, planar gate electrode 130b includes a lower gate 126a and an upper gate 128b, which are stacked sequentially. An upper surface of lower gate 126a has the same height as sidewall gate 124a in fin region 50 and upper gate 128b generally has the same thickness as top gate 128a . Accordingly, upper surfaces of upper gate 128b and top gate 128a typically have the same height. In other words, upper surfaces of fin gate electrode 130a and planar gate electrode 130b generally have the same height.

In FIG. 4, respective lower surfaces of sidewall gate 124a and lower gate 126a are formed with the same height by controlling the height of the upper surface of fin device isolation layer 115a. In addition, the upper surfaces of fin gate electrode 130a and planar gate electrode 130b have the same height. Accordingly, fin gate electrode 130a and planar gate electrode 130b each have the same overall thickness.

First gate insulating layer 122a is typically formed of a silicon oxide layer (e.g., a thermal oxide layer), a silicon nitride layer and/or a silicon oxynitride layer. In addition, first gate insulating layer 122a may be formed of a high-k dielectric layer with a relatively high dielectric constant compared to the silicon nitride layer. For instance, the first gate insulating layer 122a is preferably formed of hafnium oxide ($HfO_2$), hafnium silicate (HfSiO), hafnium silicate nitride (HfSiON), hafnium tantalum oxide ($Ta_2O_5$), zirconium oxide ($ZrO_2$), aluminum oxide ($Al_2O_3$), hafnium aluminum oxide (HfAlO), lanthanum oxide ($La_2O_3$), or a combination thereof.

Fin hard mask pattern 104a typically includes a silicon oxide layer and a silicon nitride layer, which are stacked sequentially. Second gate insulating layer 122b is generally formed of a silicon oxide layer (particularly, a thermal oxide layer), a silicon nitride layer and/or a silicon oxynitride layer. Second gate insulating layer 122b is typically formed of a high-k dielectric layer having a relatively high dielectric constant compared to the silicon nitride layer. For example, second gate insulating layer 122b is preferably formed of hafnium oxide ($HfO_2$), hafnium silicate (HfSiO), hafnium silicate nitride HfSiON, hafnium tantalum oxide ($Ta_2O_5$), zirconium oxide ($ZrO_2$), aluminum oxide ($Al_2O_3$), hafnium aluminum oxide (HfAlO), lanthanum oxide ($La_2O_3$), or a combination thereof. First and second gate insulating layers 122a and 122b typically have the same thickness as each other, although this does not necessarily have to be the case.

Sidewall gate 124a and top gate 128a of fin gate electrode 130a are formed of a conductive layer. For example, sidewall gate 124a and top gate 128a may be formed of a doped polysilicon layer and/or a low resistance conductor. In this case, lower gate 126a of planar gate electrode 130b is preferably formed of the same material as sidewall gate 124a. Top gate 128a of fin gate electrode 130a and upper gate 128b of planar gate electrode 130b are typically formed of the same material. Top gate 128a and upper gate 128b may include doped polysilicon and a low resistance conductor, which are sequentially stacked. The low resistance conductor generally comprises at least one element selected from a group consisting of conductive a metal nitride (e.g., titanium nitride, tantalum nitride), a metal (e.g., tungsten, molybdenum), and a metal silicide (e.g., cobalt silicide, nickel silicide, titanium silicide, tungsten silicide).

A first impurity doped layer 132a is formed in fin active region 106a on both sides of fin gate electrode 130a. First impurity doped layer 132a corresponds to source/drain regions of a fin transistor. A second impurity doped layer 132b is formed in planar active region 106b on both sides of planar gate electrode 130b. Second impurity doped layer 132b corresponds to source/drain regions of a planar transistor.

Figure 1:
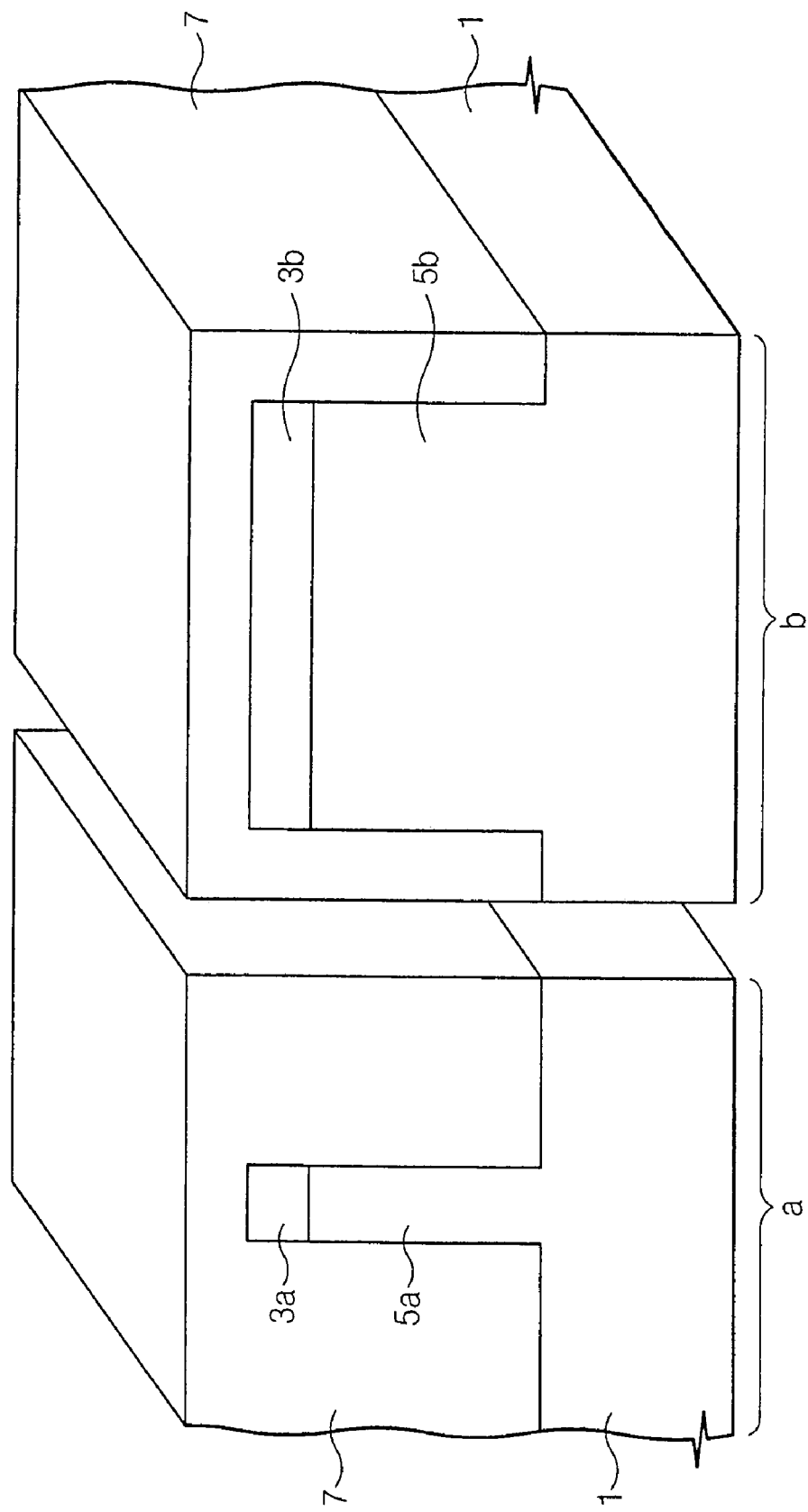
FIGS. 1 to 3 are perspective views illustrating a method of forming a semiconductor device having conventional fin and planar transistors.
Figure 2:
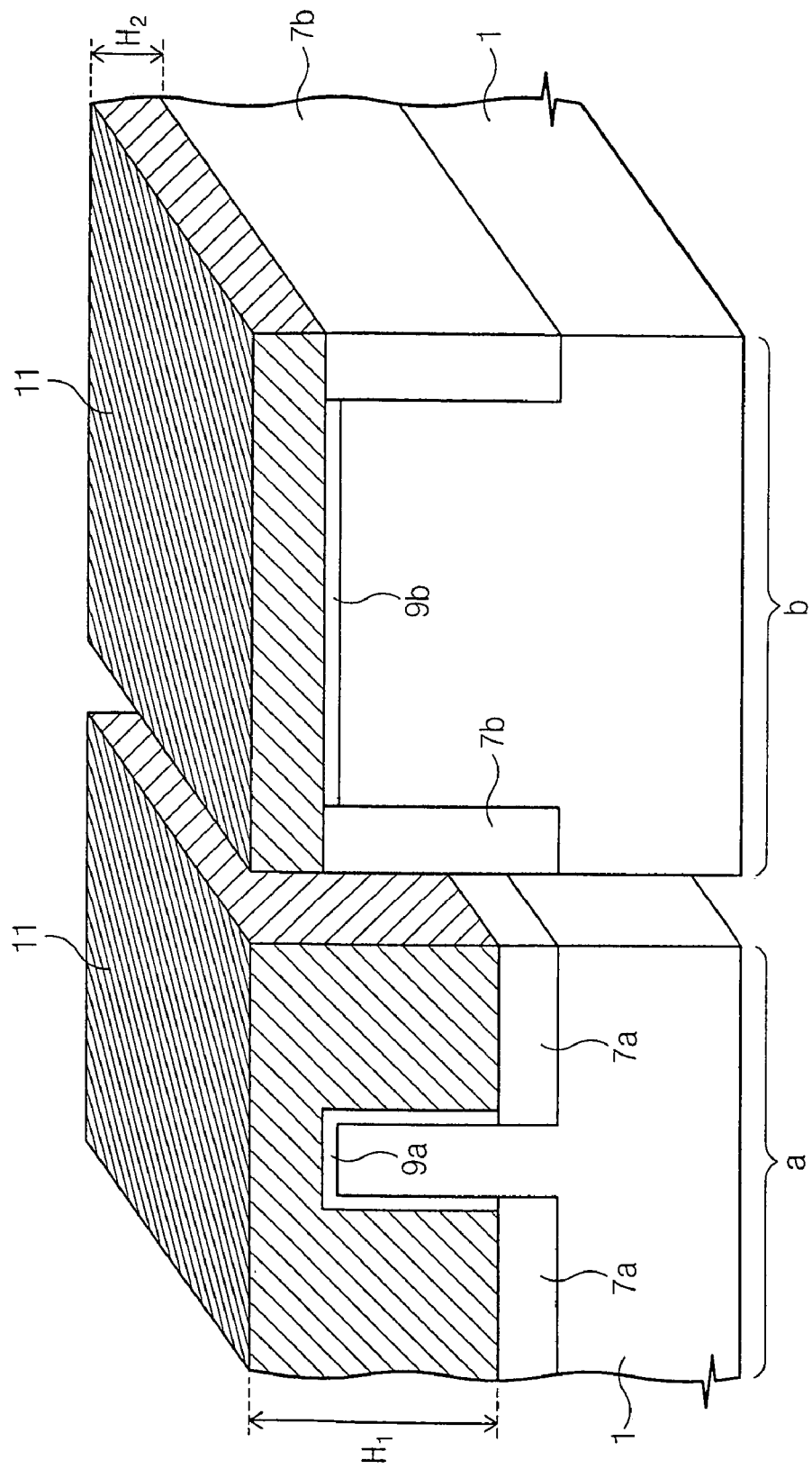
Figure 3:
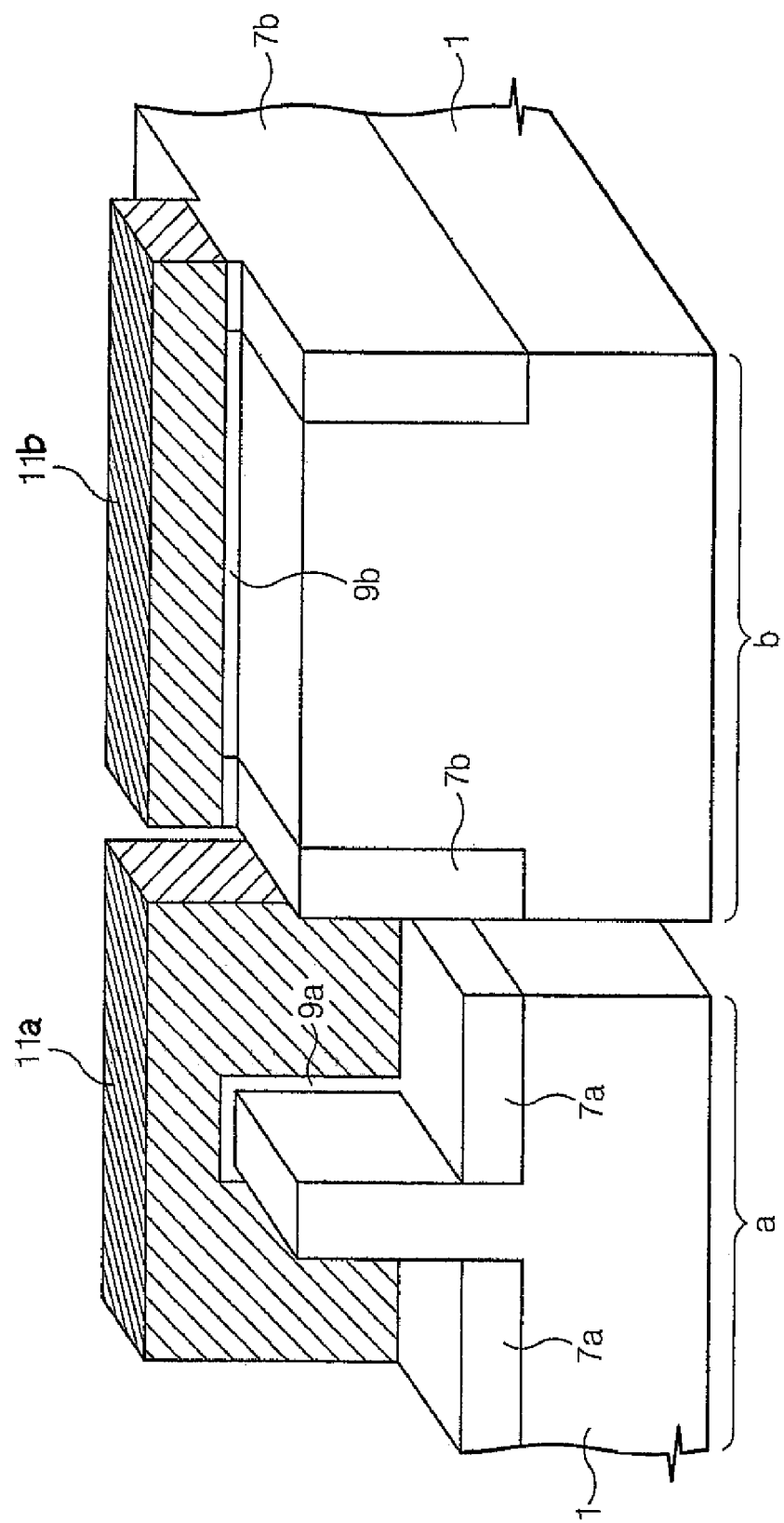

In the semiconductor device of FIG. 4, the upper surface of planar active region 106b is relatively lower than that of the fin active region 106a . However, the difference between the thicknesses of fin gate electrode 130a and planar gate electrode 130b is dramatically less than the difference between fin gate electrode 11a and planar gate electrode 11b in FIG. 3. Accordingly, etching damage is prevented from occurring in planar active region 106b and second gate insulating layer 122b during etching processes used to form respective fin and planar gate electrodes 130a and 130b.

FIGS. 6 through 14 are perspective views illustrating a method of forming a semiconductor device having a fin transistor and a planar transistor according to an embodiment of the present invention.

Figure 6:
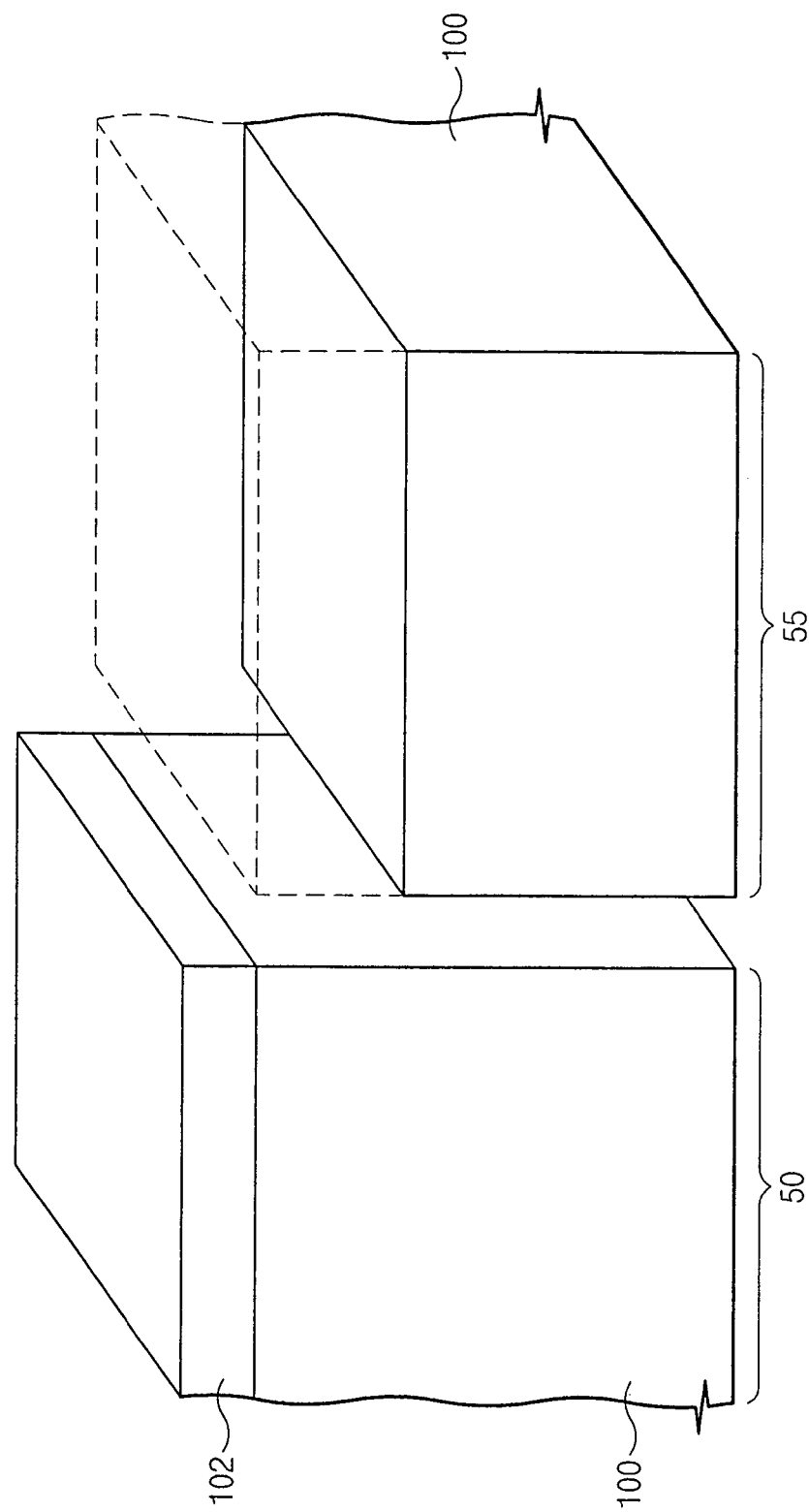

Referring to FIG. 6, a first etch mask pattern 102 is formed on substrate 100 in fin region 50, leaving substrate 100 exposed in planar region 55. First etch mask pattern 102 is formed of a material having an etch selectivity relative to substrate 100. For example, first etch mask pattern 102 is generally formed of a photo sensitive layer, a silicon oxide layer, a silicon nitride layer, a silicon oxynitride layer, or a combination thereof.

Substrate 100 is etched to recess substrate 100 in planar region 55 using first etch mask pattern 102 as an etch mask. In FIG. 6, a dotted line in planar region 55 indicates the etched portion of substrate 100.

Figure 7:
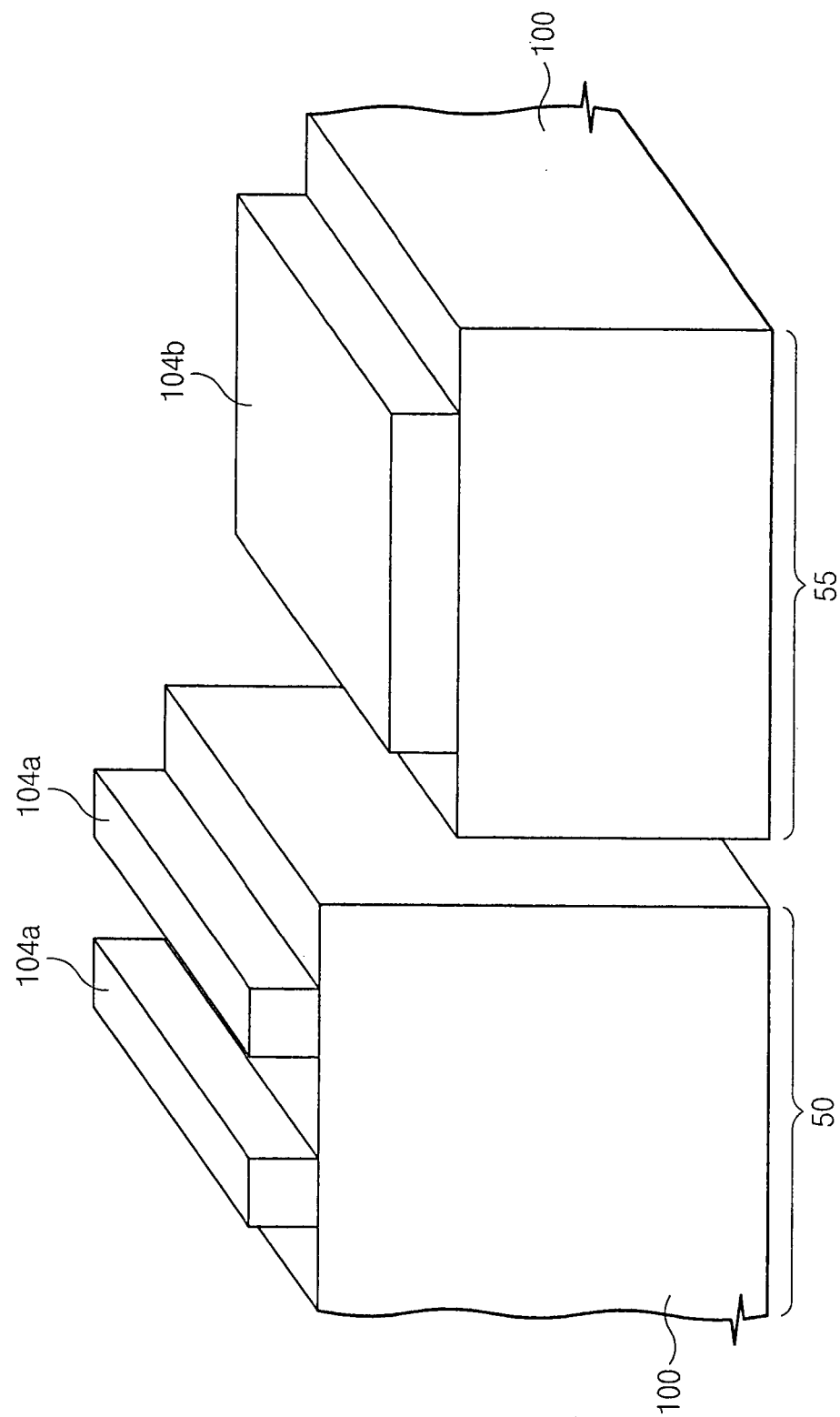

Referring to FIG. 7, first etch mask pattern 102 is removed to expose substrate 100 in fin region 50. Then, a hard mask layer is formed over the entire surface of substrate 100, and the hard mask layer is patterned to form a fin hard mask pattern 104a and a planar hard mask pattern 104b. Fin hard mask pattern 104a is formed on substrate 100 in fin region 50, and planar mask pattern 104b is formed on substrate 100 in planar region 50. Planar hard mask pattern 104b is relatively wider than fin hard mask pattern 104a. Fin and planar hard mask patterns 104a and 104b are generally formed at the same time. However, where there is a difficulty performing a photolithography process due to the difference of the height of substrate 100 between regions 50 and 55, fin and planar hard mask patterns 104a and 104b may be formed sequentially.

Preferably, hard mask patterns 104a and 104b are formed of at least one insulating layer having an etch selectivity relative to substrate 100. For example, hard mask patterns 104a and 104b typically include a silicon nitride layer and a silicon oxynitride layer. Hard mask patterns 104a and 104b may further include a buffer oxide layer interposed between the silicon nitride layer (or silicon oxynitride layer) and substrate 100. The buffer oxide layer typically performs a function of buffering stress between the silicon nitride layer (or silicon oxynitride layer) and substrate 100.

Figure 8:
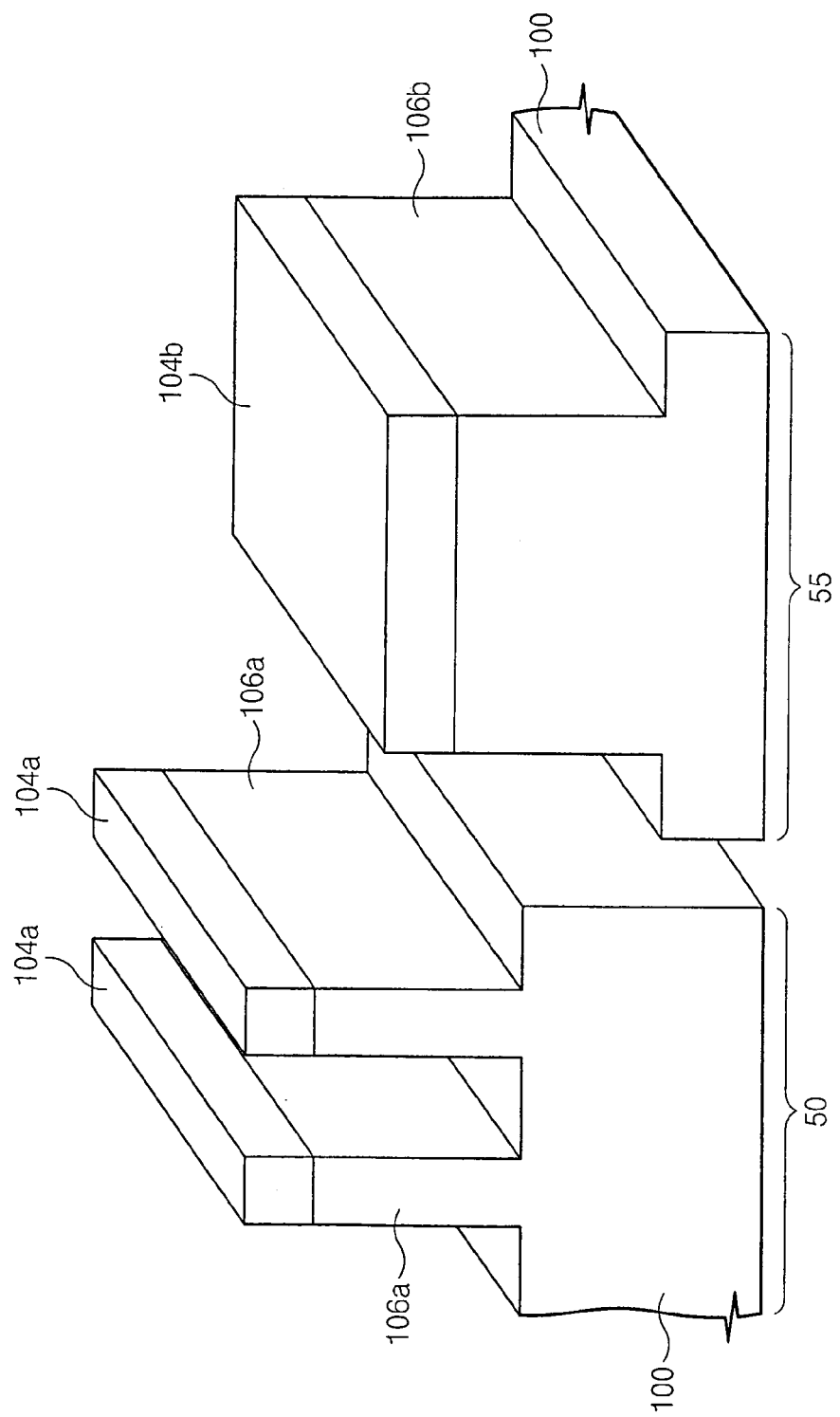

Referring to FIG. 8, substrate 100 is etched using hard mask patterns 104a and 104b as an etch mask to form fin active region 106a and planar active region 106b. First trenches surround fin active region 106a in fin region 50 and second trenches surround planar active region 106b in planar region 55, and a bottom surface of the second trenches is lower than a bottom surface of the first trenches.

Fin active region 106a protrudes upwards from substrate 100 in fin region 50 and planar active region 106b protrudes upwards from substrate 100 in planar region 55. The upper surface planar active region 106b is lower than that of fin active region 106a.

Figure 9:
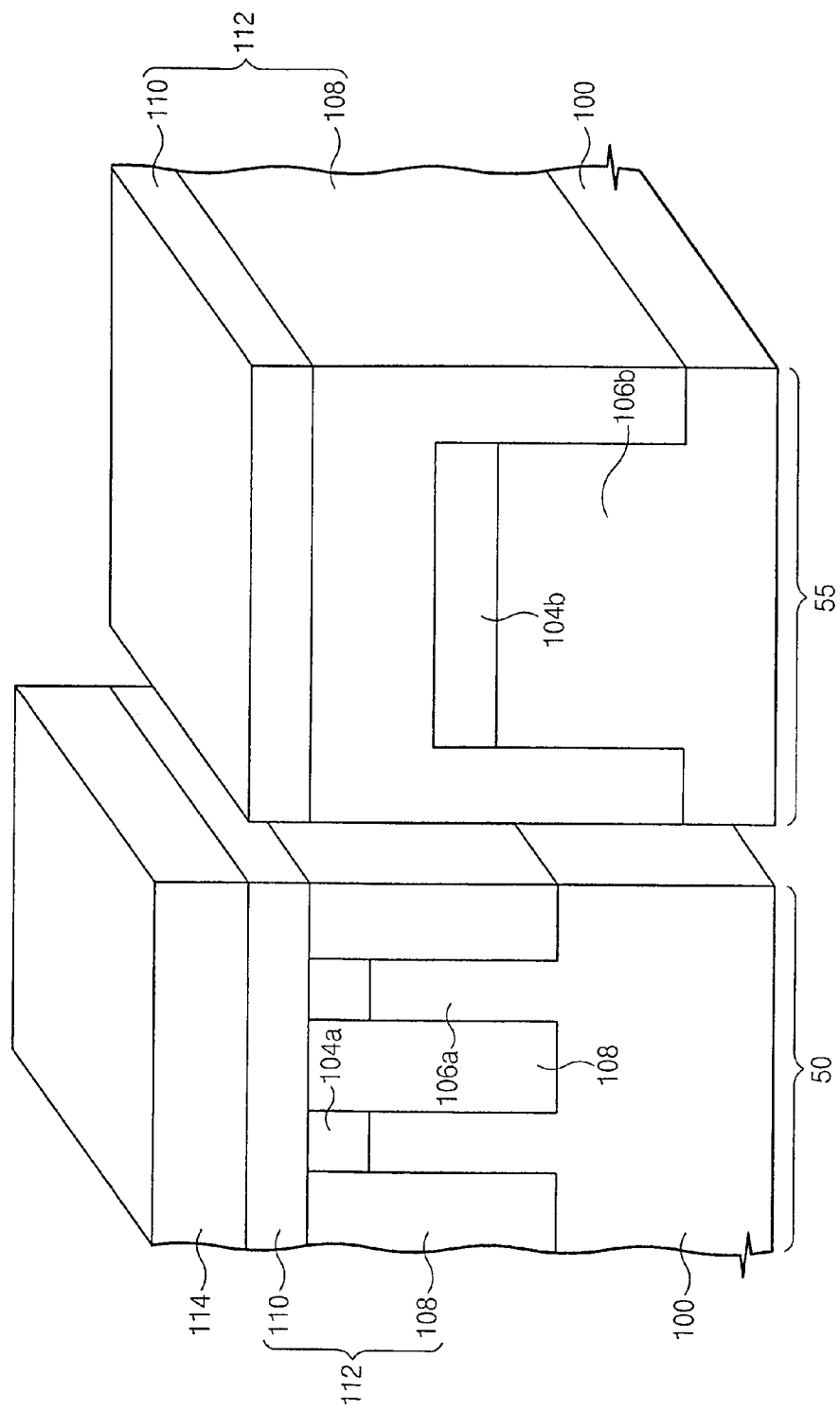

Referring to FIG. 9, a device isolation insulating layer 112 filling the first and second trenches and completely covering hard mask patterns 104a and 104b is formed over the entire surface of substrate 100. An upper surface of device isolation insulating layer 112 is planarized so that upper surface of device isolation insulating layer 112 has the same height in fin region 50 and planar region 55.

The following steps provide one way of forming device isolation insulating layer 112. A first insulating layer 108 filling the first and second trenches is formed over an entire surface of substrate 100. Then, first insulating layer 108 is planarized until the upper surface of fin hard mask pattern 104a is exposed. Then, a second insulating layer 110 is formed on planarized first insulating layer 108. First and second insulating layers 108 and 110 typically comprise silicon nitride layers.

A second etch mask pattern 114 is formed on device isolation insulating layer 112 in fin region 50, leaving device isolation insulating layer 112 exposed in planar region 55. Second etch mask pattern 114 is formed of a material having an etch selectivity relative to device isolation insulating layer 112. For instance, second etch mask pattern 114 is generally formed of a photo sensitive layer, a silicon nitride layer, a silicon oxynitride layer, or a polysilicon layer.

Figure 10:
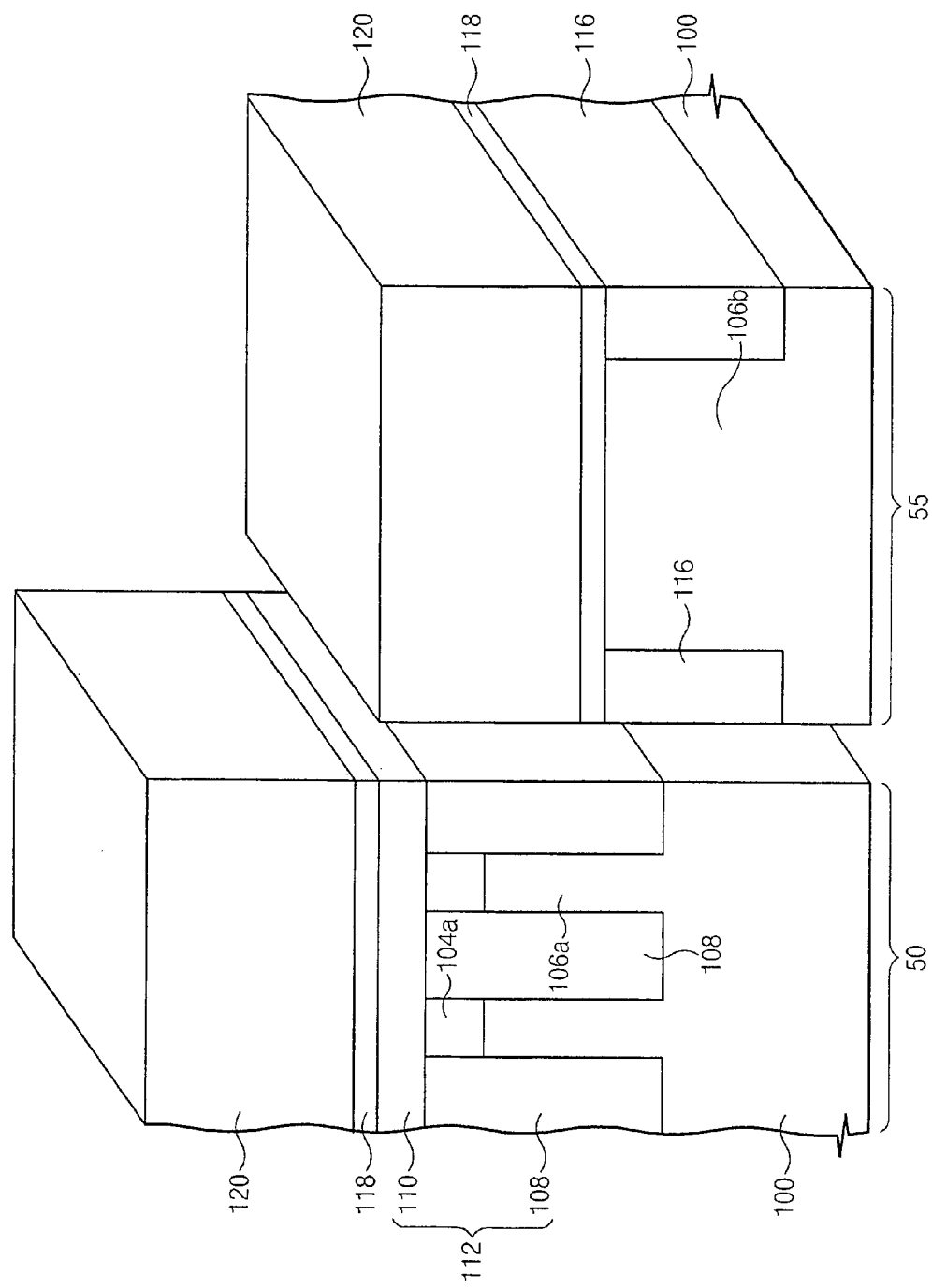

Referring to FIG. 10, by using second etch mask pattern 114 as a mask, device isolation insulating layer 112 in planar region 55 is planarized using an etch-back process until planar hard mask pattern 104b is exposed. As a result, a planar device isolation layer 116 filling the second trench is formed. Planar device isolation layer 116 covers sidewalls of planar active region 106b.

Exposed planar hard mask pattern 104b is typically removed after second etch mask pattern 114 is removed. Alternatively, however, exposed planar hard mask pattern 104b can be removed before second etch mask pattern 114 is removed.

In the event that the upper surface of planar device isolation layer 116 protrudes over the upper surface of planar active region 106b, an additional process for removing part of planar device isolation layer 116 may be performed. After performing the additional process, the upper surface of planar device isolation layer 116 has roughly the same height as the upper surface of planar active region 106b and planar active region 116 completely covers sidewalls all of planar active region 106b.

An etch stop layer 118 is formed over the entire surface of substrate 100. Etch stop layer 118 is higher in fin region 50 than in planar region 55 because of the height of device isolation insulating layer 112 in fin region 50. Etch stop layer 118 is typically formed of a material having an etch selectivity relative to device isolation insulating layer 112 in fin region 50. For instance, etch stop layer 118 is typically formed of a double layer comprising a silicon oxide layer and a silicon nitride layer, or a silicon oxide layer and a silicon oxynitride layer.

A buffer layer 120 is formed on etch stop layer 118 such that an upper surface of buffer layer 120 in fin region 50 is higher than an upper surface of buffer layer 120 in planar region 55. Buffer layer 120 is preferably formed of a silicon oxide layer.

Figure 11:
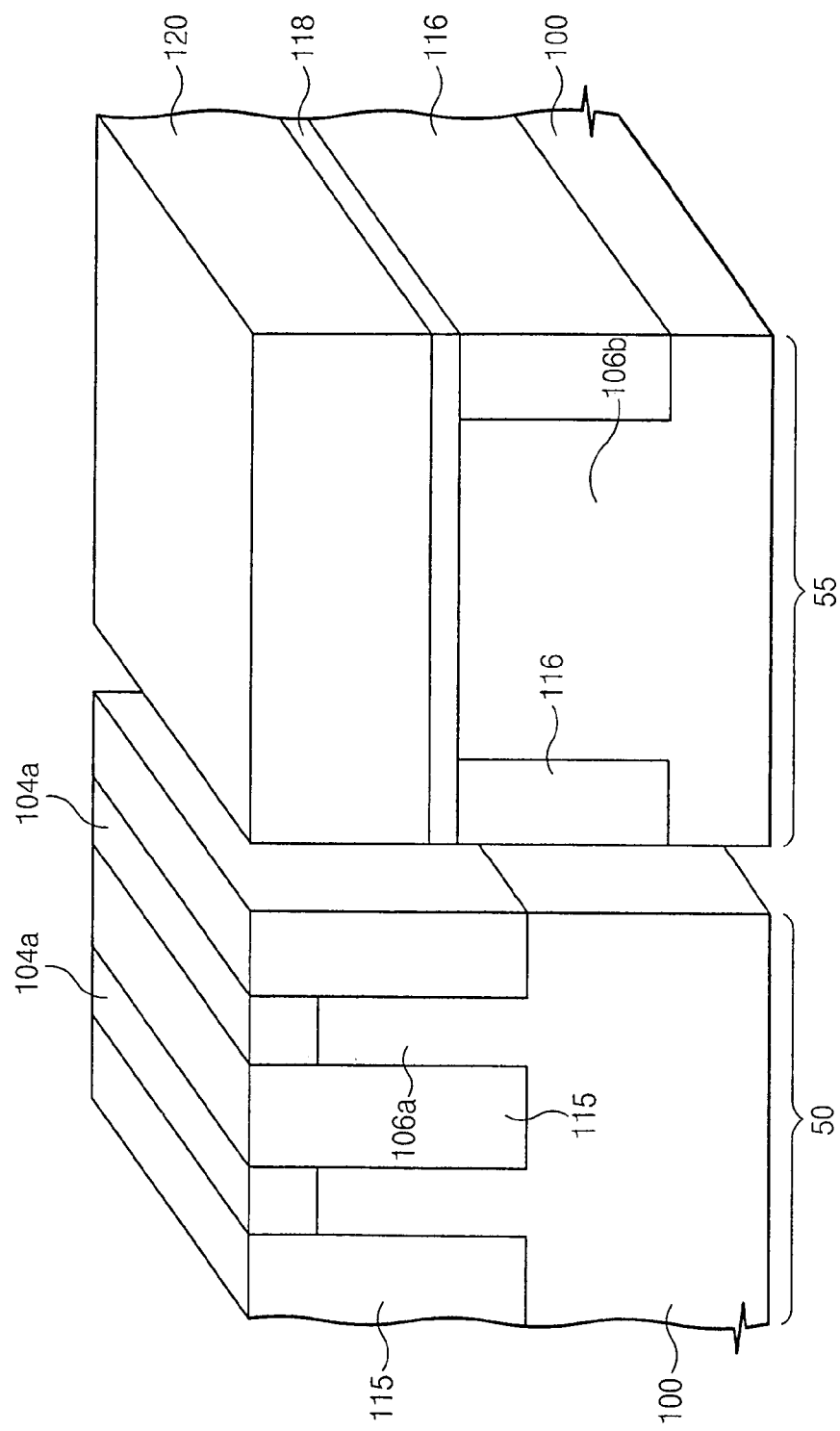

Referring to FIG. 11, buffer layer 120, etch stop layer 118, and device isolation insulating layer 112 in fin region 50 are removed by a Chemical Mechanical Polishing (CMP) process until fin hard mask pattern 104a is exposed. As a result, a preliminary fin device isolation layer 115 filling the first trench is formed in fin region 50 while buffer layer 120 remains in planar region 55. In this case, an upper surface of preliminary fin device isolation layer 115 generally has the same height as an upper surface of buffer layer 120 in planar region 55.

Buffer layer 120, etch stop layer 118, and device isolation insulating layer 112 may be planarized together by a single CMP process. Alternatively, buffer layer 120 may be planarized using the following steps. A first CMP is performed until etch stop layer 118 of fin region 50 is exposed. Exposed etch stop layer 118 is then removed using a wet etch process. A second CMP is performed with respect to device isolation insulating layer 112 in fin region 50. While the first and second CMP processes are performed, buffer layer 120 in planar region 55 is also planarized.

Figure 12:
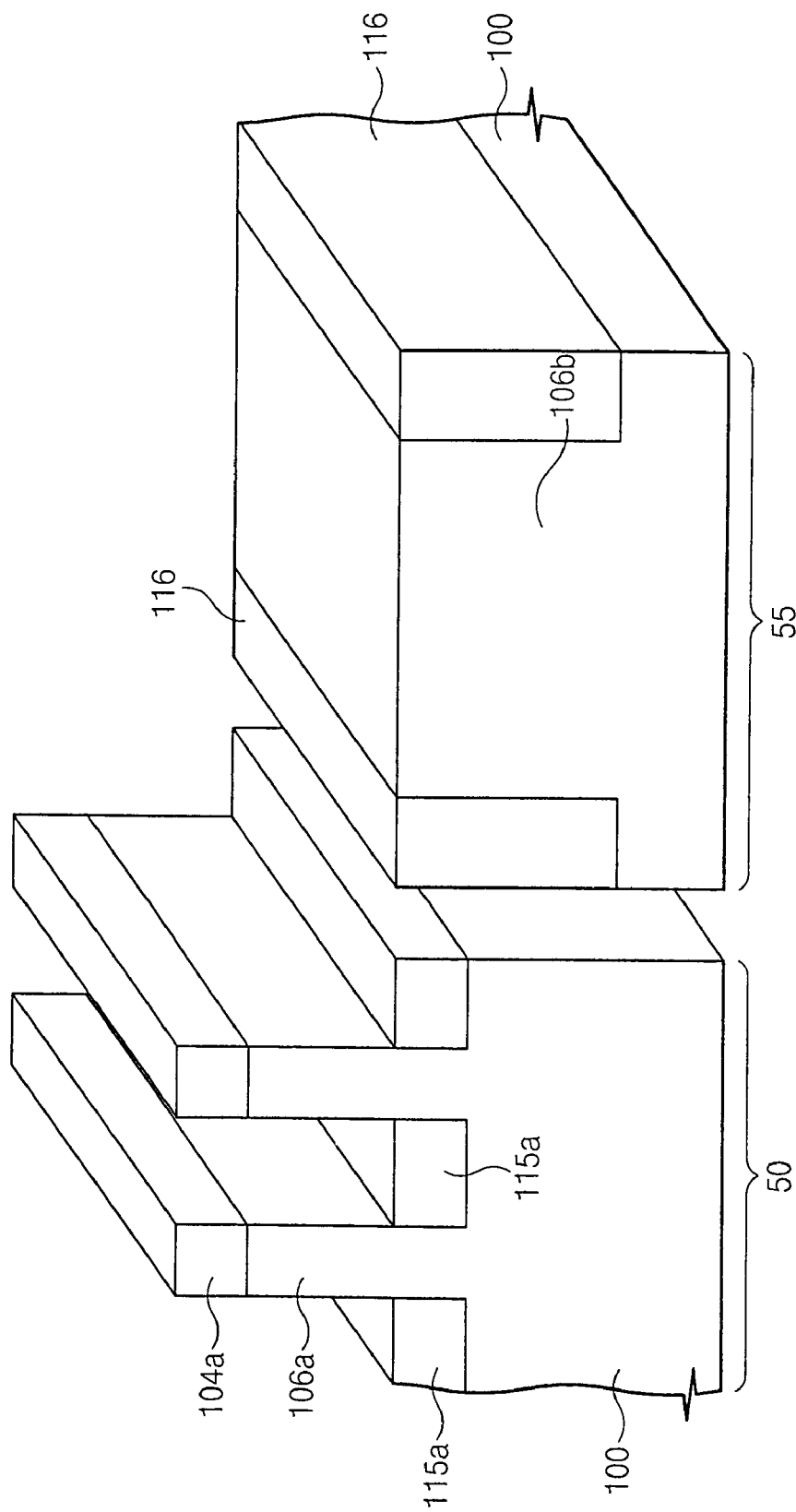

Referring to FIG. 12, a fin device isolation layer 115a is formed by etching preliminary fin device isolation layer 115 and buffer layer 120 in planar region 55 until etch stop layer 118 in planar region 55 is exposed. Accordingly, the upper surface of fin device isolation layer 115a has a height similar to that of the upper surface of planar active region 106b. Fin device isolation layer 115a covers lower sidewalls of fin active region 106a, leaving upper sidewalls of fin active region 106a exposed. After etch stop layer 118 is exposed, a time-etch process for controlling the height of the upper surface of fin device isolation layer 115a may be further performed. It is possible to control the height of the upper surface of fin device isolation layer 115a by controlling the time-etch process so that the upper surface of fin device isolation layer 115a is the same as the height of the upper surface of planar active region 106b. Exposed etch stop layer 118 in planar region 55 is removed to expose planar active region 106b.

Referring to FIG. 13, first gate insulating layer 122a is formed on the exposed surface of fin active region 106a. Second gate insulating layer 122b is formed on the exposed surface of planar active region 106b. First and second gate insulating layers 122a and 122b are typically formed of a silicon oxide layer (e.g., a thermal oxide layer), a silicon nitride layer, and/or a silicon oxynitride layer. First and second gate insulating layers 122a and 122b preferably have the same thickness, however, they may also be formed to have different thicknesses (e.g., by performing a selective thermal oxidation process using an oxidation barrier layer). Moreover, first and second gate insulating layers 122a and 122b may be formed of a high-k dielectric layer having a relatively high dielectric constant compared with the silicon nitride layer. For example, first and second gate insulating layers 122a and 122b may be formed of hafnium oxide ($HfO_2$), hafnium silicate (HfSiO), hafnium silicate nitride (HfSiON), hafnium tantalum oxide ($Ta_2O_5$), zirconium oxide ($ZrO_2$), aluminum oxide ($Al_2O_3$), hafnium aluminum oxide (HfAlO), lanthanum oxide ($La_2O_3$), or a combination thereof.

A first gate conductive layer is then formed over the entire surface of substrate 100. The first gate conductive layer is planarized by CMP until fin hard mask pattern 104a is exposed, thus forming a sidewall gate conductive layer 124 filling the first trenches on fin device isolation layer 115a in fin region 50, and a lower gate conductive layer 126 in planar region 55.

An upper surface of sidewall gate conductive layer 124 in fin region 50 has the same height as an upper surface of lower gate conductive layer 126 in planar region 55. Sidewall gate conductive layer 124 and lower gate conductive layer 126 are generally formed of a doped polysilicon layer and/or a low resistance conductor. The low resistance conductor generally includes at least one element selected from a group consisting of a conductive metal nitride (e.g., titanium nitride and tantalum nitride), a metal (e.g., tungsten and molybdenum), and a metal silicide (e.g., cobalt silicide, nickel silicide, titanium silicide, and tungsten silicide).

Referring to FIG. 14, a second gate conductive layer 128 is formed over the entire surface of substrate 100. Second gate conductive layer 128 typically includes doped polysilicon and a low resistance conductor, which are stacked sequentially. The low resistance conductor typically includes at least one element selected from a group consisting of conductive a metal nitride (e.g., titanium nitride and tantalum nitride), a metal (e.g., tungsten and molybdenum), and a metal silicide (e.g., cobalt silicide, nickel silicide, titanium silicide, and tungsten silicide).

The sum of the thicknesses of the sidewall gate conductive layer 124 and second gate conductive layer 128 on fin device isolation layer 115a may be defined as a first thickness "T1", and the sum of the thicknesses of lower gate conductive layer 126 and second gate conductive layer 128 over planar active region 106b may be defined as a second thickness "T2".

Second gate conductive layer 128, sidewall gate conductive layer 124, and lower gate conductive layer 126 are patterned to form fin gate electrode 130a and planar gate electrode 130b, which are shown in FIG. 4. Fin gate electrode 130a includes a sidewall gate 124a formed from sidewall gate conductive layer 124 and a top gate 128a formed from second gate conductive layer 128. Planar gate electrode 130b includes a lower gate 126a formed from lower gate conductive layer 126 and an upper gate 128b formed from second gate conductive layer 128.

Impurity ions are implanted into fin active region 106a and planar active region 106b using fin gate electrode 130a and planar gate electrode 130b as masks to form respective first and second impurity doped layers 132a and 132b shown in FIG. 4. First and second impurity doped layers 132a and 132b may be formed either sequentially or simultaneously.

In the above-described method of forming a semiconductor device, the upper surface of planar active region 106b is formed to be lower than fin active region 106a by selectively recessing substrate 100 in planar region 55. Accordingly, the difference between the thicknesses of gate electrodes formed in fin region 50 and fin region 55 are small compared with the difference between corresponding thicknesses in a conventional device such as that shown in FIG. 3. As a result, etching damage is prevented from occurring in planar active region 55 and/or gate insulating layer 122b during the formation of planar gate electrode 130b.

More particularly, the upper surface of second gate conductive layer 128 in the fin region 50 has the same height as second gate conductive layer 128 in planar region 55 owing to sidewall gate conductive layer 124 and lower gate conductive layer 126. As a result, the difference between first thickness "T1" and second thickness "T2" is minimized. Furthermore, first thickness "T1" and second thickness "T2" may be formed to be equal by controlling the height of the upper surface of fin device isolation layer 115a. Therefore, it is possible to prevent etching damage in a planar active region and/or a gate oxide layer due to the similarity between first thickness "T1" and second thickness "T2".

As previously mentioned, a planar active region is formed to be lower than the fin active region to minimize a thickness difference between a fin gate electrode and a planar gate electrode. Minimizing the thickness difference between the fin gate electrode and the planar gate electrode prevents damage from occurring in the manufacture of the semiconductor device to preserve the device's electrical characteristics.

What is claimed is:

1. A semiconductor device, comprising:
   a fin active region formed on a fin region of a semiconductor substrate, the fin active region protruding upward from the semiconductor substrate and comprising an upper surface and lower sidewalls;
   a planar active region formed on a planar region of the semiconductor substrate, the planar active region protruding upward from the semiconductor substrate and comprising sidewalls and an upper surface, wherein the upper surface of the planar active region is disposed lower than the upper surface of the fin active region;
   a fin device isolation layer covering the lower sidewalls of the fin active region and extending a first depth into the semiconductor substrate;
   a planar device isolation layer completely covering sidewalls of the planar active region and extending a second depth into the semiconductor substrate, wherein the second depth extends deeper into the semiconductor substrate than the first depth;
   a fin gate electrode formed across the fin active region; and,
   a planar gate electrode formed across the planar active region.

2. The semiconductor device of claim 1, further comprising:
   a first gate insulating layer formed between the fin gate electrode and upper sidewalls of the fin active region;
   a fin hard mask pattern formed between the fin gate electrode and the upper surface of the fin active region; and,
   a second gate insulating layer formed between the planar gate electrode and the upper surface of the planar active region.

3. The semiconductor device of claim 2, wherein the fin gate electrode comprises:
   a sidewall gate formed on the upper sidewalls of the fin active region, wherein the first gate insulating layer is interposed between the sidewall gate and the upper sidewalls of the fin active region; and,
   a top gate formed over the fin active region on the fin hard mask pattern,
   wherein an upper surface of the sidewall gate has the same height as an upper surface of the fin hard mask pattern; and,
   wherein the top gate is electrically connected to the sidewall gate.

4. The semiconductor device of claim 3, wherein the planar gate electrode comprises:
   a lower gate formed from the same material as the sidewall gate;
   and an upper gate formed on the lower gate from the same material as the top gate.

5. The semiconductor device of claim 4, wherein the lower gate has an upper surface with the same height as the upper surface of the sidewall gate; and,
   wherein the upper gate has an upper surface with the same height as an upper surface of the top gate.

6. The semiconductor device of claim 2, wherein the first and second gate insulating layers are formed from a high-k dielectric layer having a relatively high dielectric constant compared with a silicon nitride layer.

7. The semiconductor device of claim 1, wherein the fin gate electrode and the planar gate electrode have the same thickness.

8. The semiconductor device of claim 1, further comprising:
   a first impurity doped layer formed in the fin active region on opposite sides of the fin gate electrode; and,
   a second impurity doped layer formed in the fin planar active region on opposite sides of the planar gate electrode.

9. The semiconductor device of claim 2, wherein the first or second gate insulating layer is formed of hafnium oxide ($HfO_2$), hafnium silicate (HfSiO), hafnium silicate nitride (HfSiON), hafnium tantalum oxide ($Ta_2O_5$), zirconium oxide ($ZrO_2$) aluminum oxide ($Al_2O_3$) hafnium aluminum oxide (HfAlO), lanthanum oxide ($La_2O_3$), or a combination thereof.

10. The semiconductor device of claim 3, wherein the top gate comprises a low resistance conductor comprising at least one element selected from a group consisting of: titanium nitride, tantalum nitride, tungsten, molybdenum, cobalt silicide, nickel silicide, titanium silicide, and tungsten silicide.

11. A method of forming a semiconductor device, the method comprising:
- forming a fin active region on a semiconductor substrate defining a fin region and a planar region, the fin active region protruding upward from the semiconductor substrate in the fin region;
- forming a planar active region on the semiconductor substrate, the planar active region protruding upward from the semiconductor substrate in the planar region and having an upper surface which is lower than an upper surface of the fin active region;
- forming a fin device isolation layer covering lower sidewalls of the fin active region and extending a first depth into the semiconductor substrate;
- forming a planar device isolation layer completely covering sidewalls of the planar active region and extending a second depth into the semiconductor substrate, wherein the second depth extends deeper into the substrate than the first depth;
- forming a fin gate electrode across the fin active region; and,
- forming a planar gate electrode across the planar active region.

12. The method of claim 11, further comprising:
- forming a first impurity doped layer in the fin active region on opposite sides of the fin gate electrode; and,
- forming a second impurity doped layer in the planar active region on opposite sides of the planar gate electrode.

13. The semiconductor device of claim 1, wherein the fin active region is directly formed on the fin region of the semiconductor substrate in electrical contact with the semiconductor substrate.

14. The method of claim 11, wherein forming the fin active region on the semiconductor substrate comprises forming the fin active region directly on and in electrical contact with the semiconductor substrate.

* * * * *